United States Patent [19]

Daniele et al.

[11] Patent Number: 4,875,020

[45] Date of Patent: Oct. 17, 1989

[54] ANALOG INTEGRATED CIRCUIT HAVING INTRINSIC TOPOLOGIES AND CHARACTERISTICS SELECTABLE BY A DIGITAL CONTROL

[75] Inventors: Vincenzo Daniele, Brugherio; Marco M. Monti, Milano; Michele Taliercio, Arluno; Piero Capocelli, Milano, all of Italy

[73] Assignee: SGS-Thomson Microelectronics s.r.l., Italy

[21] Appl. No.: 287,299

[22] Filed: Dec. 21, 1988

[30] Foreign Application Priority Data

Dec. 22, 1987 [IT] Italy .............................. 83684 A/87

[51] Int. Cl.[4] .......................... H03F 3/04; H03F 3/16

[52] U.S. Cl. .................................... 330/307; 330/277

[58] Field of Search ............... 330/253, 255, 277, 295, 330/307; 307/201; 364/807

[56] References Cited

U.S. PATENT DOCUMENTS 4,641,108 2/1987 Gill, Jr. .............................. 330/307

*Primary Examiner*—Steven Mottola

*Attorney, Agent, or Firm*—Pollock, Vande, Sande & Priddy

[57] ABSTRACT

An integrated analog circuit having a circuit topology and intrinsic characteristics which may be selected by digital control means is formed by batteries of similar circuit components arranged substantially in parallel or in a matrix array, anyone of which may be isolated or not by means of a dedicated integrated switch and by alternative interconnection paths among the different circuit components and/or batteries of circuit components, which may be also be selected by closing a relative integrated switch. A dedicated nonvolatile memory, integrated on the same chip may be permanently programmed and determine a certain configuration of all the integrated switches thus selected a particlar component or more components of each of said batteries of functionally similar components, and/or selecting a certain interconnection path among the different circuit components in order to form a functional integrated circuit having the desired topology and intrinsic characteristics. The integrated nonvolatile memory is programmed by means of a software program which may take as input data the desired values of the different parameters which determine the intrinsic characteristics of the functional analog circuit and the type of functional analog circuit itself.

17 Claims, 8 Drawing Sheets

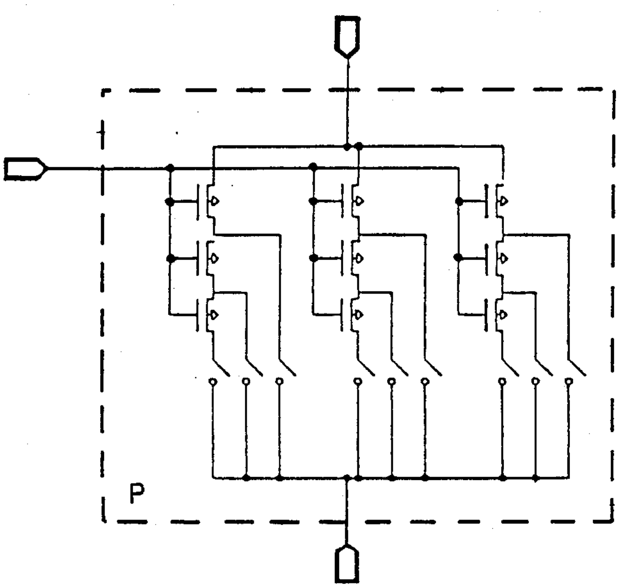
FIG. 8
FIG. 9
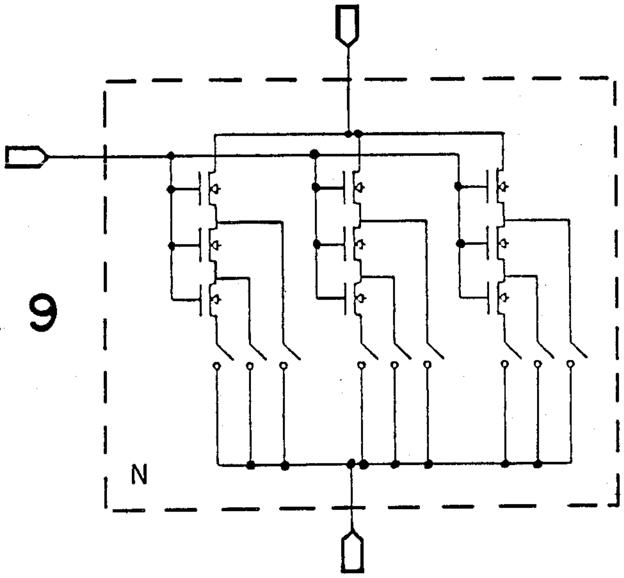
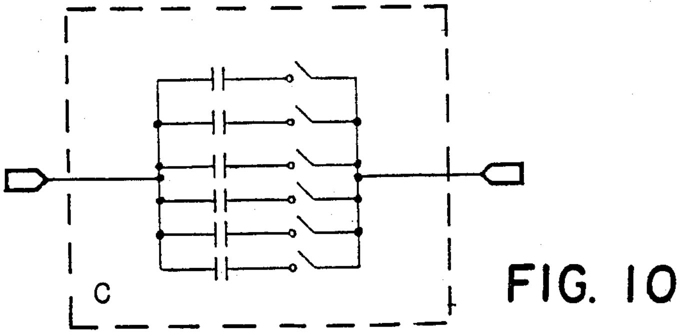
FIG. 10

ANALOG INTEGRATED CIRCUIT HAVING INTRINSIC TOPOLOGIES AND CHARACTERISTICS SELECTABLE BY A DIGITAL CONTROL

BACKGROUND OF THE INVENTION

1. Field of the Invention

The present invention relates to integrated circuits and, more in particular, to analog integrated circuits.

2. Discussion of the Prior Art

The fundamental parameters which determine the intrinsic characteristics of an analog circuit are, in large measure, determined by the intrinsic structural characteristics of particularly significant circuit components. Therefore in designing analog integrated circuits it is necessary to properly and systematically size dimensions and other structural characteristics of circuit components. A typical example is represented by the operational amplifier (truly a building block of a large number of analog circuits), which at present is made in accordance with set specifications. A customer is therefore bound to change type of integrated operational amplifier depending upon the application, as well as a semiconductor device manufacturer is obliged to redesign the operational amplifier for particular applications and therefore to change the masks used in the fabrication in order to satisfy the required specifications. The only solution known to allow a certain degree of alterability of the intrinsic characteristics of an integrated operational amplifier is to modify by external means the bias current level of the amplifier through a dedicated input pin of the integrated device. The variations of the amplifier's performances obtainable by this technique are substantially limited only to few parameters (typically the gain and the power conception) while it is difficult for example to substantially modify the pass-band width and moreover the variations which may be obtained are confined within a rather narrow range about a nominal value.

SUMMARY OF THE INVENTION

It is therefore a main objective of the present invention to provide an integrated analog circuit whose transistor and other component network may be permanently modified by the user himself by means of a digital control in order to achieve intrinsic characteristics which fall within the required specifications for a particular application.

It is a further objective of the invention to provide an integrated analog circuit whose circuit topology may be permanently modified by the user himself by means of a digital control in order to implement functional analog circuits of a different type in accordance with needs and having intrinsic characteristics which are also selectable by means of a digital control.

Basically the invention contemplates the formation in the integrated circuit of "batteries" (or arrays) of functionally similar devices arranged substantially in parallel or in a matrix arrangement, and having intrinsic characteristics (dimensions, doping levels, etc.) which may be identical or different from one another if so desired in order to offer an ample choice of characteristics by connecting in a functional circuit a plurality of identical devices in a parallel relationship to each other for incrementally varying the intrinsic characteristics of the resulting device (for a "linear" type variation of certain parameters), as well as by connecting one or the other of the single devices of a battery of devices with different intrinsic characteristics, or by connecting in a parallel relationship to each other two or more devices of a battery of devices having different structural parameters for achieving an "exponential" type of variation of the parameters which determine the intrinsic characteristics of the resulting device. Each device or unitary circuit component of each battery is provided with an integrated analog switch in series thereto functioning as selection means. Each battery of circuit components of the same type represents, within the functional analog circuit itself, a certain component of such a functional circuit.

Naturally, not all the circuit components of a certain functional integrated analog circuit need to be "multiplied" manifold in the form of a battery of unitary functionally similar circuit components capable of offering a desired range of variation of the intrinsic characteristics of the particular circuit component; but only those circuit components which are significant in terms of imparting particular intrinsic characteristics to the whole functional analog circuit may be so "multiplied" in the form of batteries. The number of unitary circuit components forming a certain battery may of course be different from the number of single circuit components forming another battery of the circuit. The number of unitary components with individually different intrinsic (structural) characteristics or of unitary identical components (summable simply in terms of dimensions) of any one battery will be designed in function of the desired extent of the variation range of the intrinsic characteristics of the particular component of the functional analog circuit which may be formed by properly interconnecting the various batteries and/or single integrated components according to a certain functional circuit diagram.

The selection of one or more particular components of each of the batteries of components present in the integrated circuit is effected by means of a nonvolatile memory integrated in the same integrated circuit chip. The state of the memory determines a certain configuration of all the integrated selection switches and the memory may be electrically programmed according to one of the common programming procedures for such nonvolatile (read only) memories. A programmed state of the memory for driving all the integrated selection switches in accordance with the desired characteristics of the functional integrated circuit may be obtained as an output generated by a software program capable of taking as input data desired values of certain different parameters which determine the intrinsic characteristics of the particular functional analog circuit desired.

The use of a nonvolatile memory ensures the retaining of the selection data (i.e. the memory configuration) also when the electrical supply to the integrated circuit is interrupted. Therefore a certain programmed configuration of the selection integrated switches of the particular circuit components chosen for realizing a functional analog circuit having certain intrinsic characteristics, remains unaltered even after switching off and switching on the integrated circuit. The memory is preferably an EAPROM (or EEPROM) type memory, i.e. the programmed state of the memory is electrically alterable by appropriate procedures in order to permit the modification of the selection of the type and/or of the intrinsic characteristics of the functional analog circuit by reprogramming the integrated nonvolatile memory by means of electrical signals without the need for irradiation type erasing treatments.

According to a further aspect of the invention, it is possible to form in the integrated circuit alternative interconnection paths among the different circuit components or among the different batteries of circuit components, which are also selectable by means of dedicated integrated analog switches which are also driven by the permanently programmed nonvolatile memory. In this way it is possible to select by means of a digital control the formation of different kinds of functional analog circuits. For instance the functional circuit which may be selectively implemented may be an operational amplifier having intrinsic characteristics which are also programmable among a range of intrinsic characteristics which may be obtained by the integrated circuit, by appropriately selecting certain circuit components of the batteries of components. Alternatively, also by means of a digital control, a functional buffer (or comparator, etc.) circuit may be implemented, having intrinsic characteristics also chosen among the intrinsic characteristics obtainable by appropriately selecting the circuit components of the respective batteries of components, b y modifying, in respect to the former selection the functional circuit of an operational amplifier, other interconnecting paths among the different circuit components and/or among the different batteries of components by means of the dedicated analog integrated switches, i.e. by modifying the topology of the integrated circuit.

The range of intrinsic characteristics and/or of functional circuit topologies is limited exclusively by integration area availability on the chip and by pins availability for the external connections of the integrated device as well as by cost-benefit considerations of such an integrated device which is adaptable to a number of different applications.

Several embodiments of the invention will be now described for illustrative and non limitative purposes. A first embodiment relates to an application for implementing a CMOS integrated operational amplifier having digitally selectable intrinsic characteristics.

A second embodiment relates to the implementation of operational amplifiers having different circuit topologies as well as to the implementation of analog comparators and buffers with different characteristics using the same integrated circuit.

BRIEF DESCRIPTION OF THE DRAWINGS

FIGS. 8, 9 and 10 are circuit diagrams of the batteries of components utilized in the integrated circuit of FIG. 7, respectively.

DESCRIPTION OF THE PREFERRED EMBODIMENTS

Figure 1:
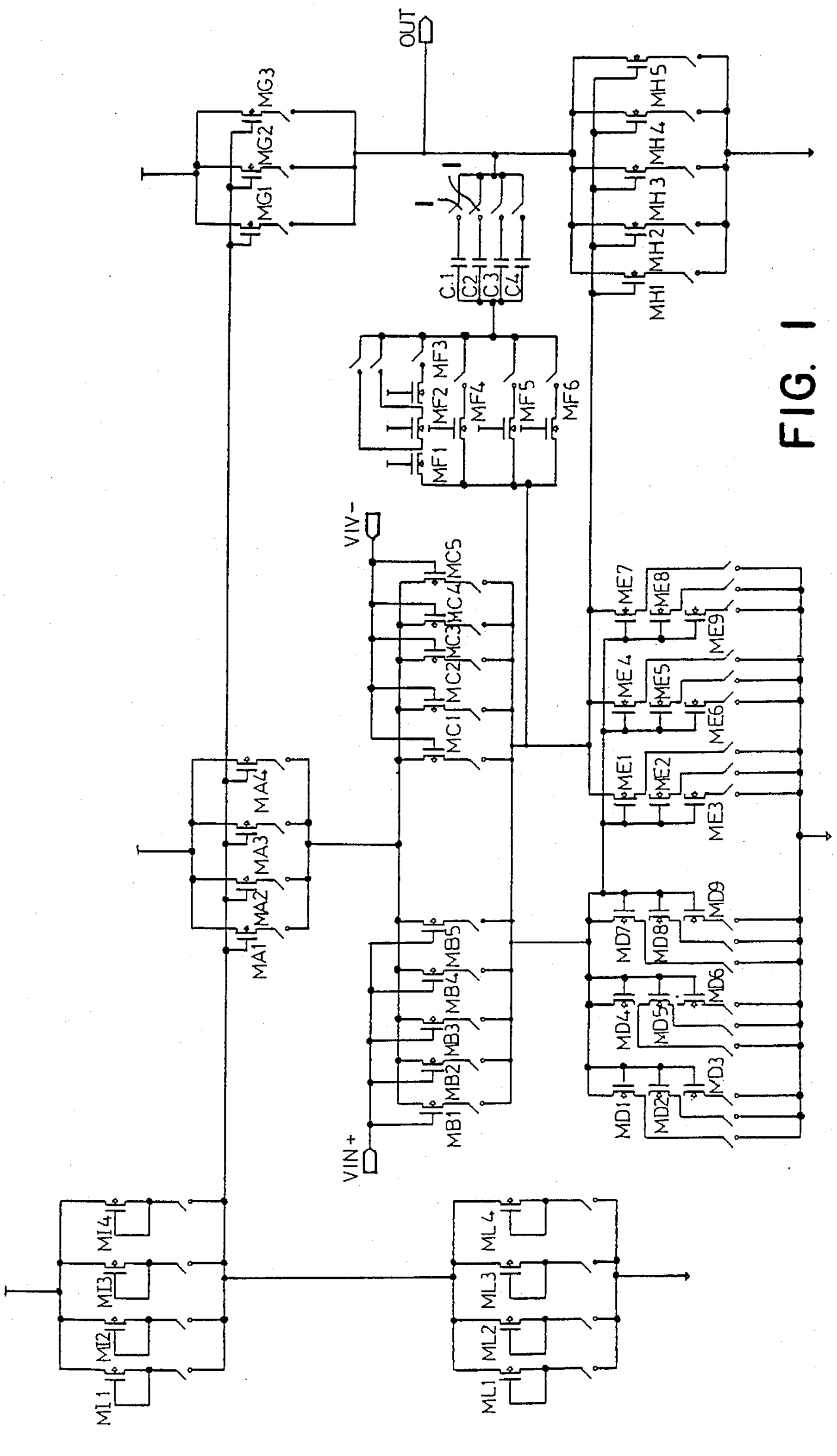
FIG. 1 is a simplified circuit diagram of an integrated operational amplifier of the invention having intrinsic characteristics which may be selected by digital control means among a number of different obtainable intrinsic characteristics.

In FIG. 1 the circuit diagram of an integrated CMOS operational amplifier made in accordance with the present invention and having intrinsic characteristics which may be selected by digital control means among a certain number of intrinsic characteristics obtainable by selecting a certain configuration of integrated selection switches is shown.

As it may be observed in FIG. 1, the operational amplifier's circuit components have been implemented in a multiple form, forming as many batteries of similar circuit components each of which may have intrinsic characteristics identical to or different from those of the other unitary components belonging to the same battery of similar components, the unitary components being connected substantially in parallel to each other and each unitary component being provided with an integrated selection switch electrically in series thereto.

Of course the selection of certain structural characteristics and therefore of certain intrinsic characteristics for a certain circuit component of the functional circuit of the operational amplifier may take place by selecting one or another of the unitary circuit components forming the relative battery as well as by selecting two or more circuit components of the same battery in order to incrementally increase parameters such as the size of the component, the intrinsic capacitances of the component, etc., or decrease the current density through the component, by closing one or the other or several integrated switches in series with the unitary components of the battery.

In the diagram shown in FIG. 1, the input differential stage of the operational amplifier is composed by the two p-channel transistor batteries MB1 . . . MB5 and MC1 . . . MC5, which form, respectively, the non-inverting input active device and the inverting input active device of an input differential pair;

the n-channel transistor batteries MD1 . . . MD9 and ME1 . . . ME9, which form an active load of the input differential stage and determine the conversion from a differential mode to a single-ended mode of the signal, these transistor batteries have been shown as having a matrix type array arrangement: transistors MD1, MD2 and MD3 being summable in series for incrementing the L (length) factor of the resulting transistor while transistors MD1 (2, 3), MD4 (5, 6) and MD7 (8, 9) being summable in parallel in order to increase the W (width) factor of the resulting transistor; and the p-channel transistor battery MA1 . . . MA4, which constitutes the biasing current generator of the input differential stage of the amplifier.

The second gain stage of the amplifier is formed by an inverter type stage; this is composed by: the n-channel transistor battery MH1 . . . MH5, which constitutes the active gain device of the second stage of the amplifier; and the p-channel transistor battery MG1 . . . MG3, which constitutes the biasing current generator of this second stage of the amplifier.

The frequency compensation network of the operational amplifier is formed by:

the n-channel transistor battery MF1 . . . MF6 (MF1, MF2 and MF3 connectable in series for increasing the L factor, i.e. the length of the resulting transistor which is then connectable in parallel to MF4, MF5 and MF6 in order to increase the factor W, i.e. the width of the resulting transistor); and the feedback capacitor battery C1 . . . C4, wherein the capacitors may be connected in parallel in the compensation network.

The functional circuit diagram of the operational amplifier of FIG. 1, comprises further a bias network formed by:

the p-channel transistor battery MI1 . . . MI4; and the p-channel transistor battery ML1 . . . ML4.

The bias network is purposely shown in a simplified form in order not to unnecessarily overburden the functional circuit diagram of the operational amplifier and in order to let more clearly stand out the essential features of the functional circuit diagram.

The components forming each battery are functionally connected substantially in parallel among each other and each component is provided with a selection switch connected electrically in series with the component itself.

The state of all the selection switches is determined by a nonvolatile memory which is integrated on the same chip although it is not shown in the figures for simplicity's sake. Such a nonvolatile integrated memory may be programmed in a permanent way in any appropriate manner, however it is preferably programmed by means of a software program capable of accepting as input data the values of the parameters which determine the intrinsic characteristics of the operational amplifier in accordance with the specifications required by the user of the integrated device.

Figure 2:
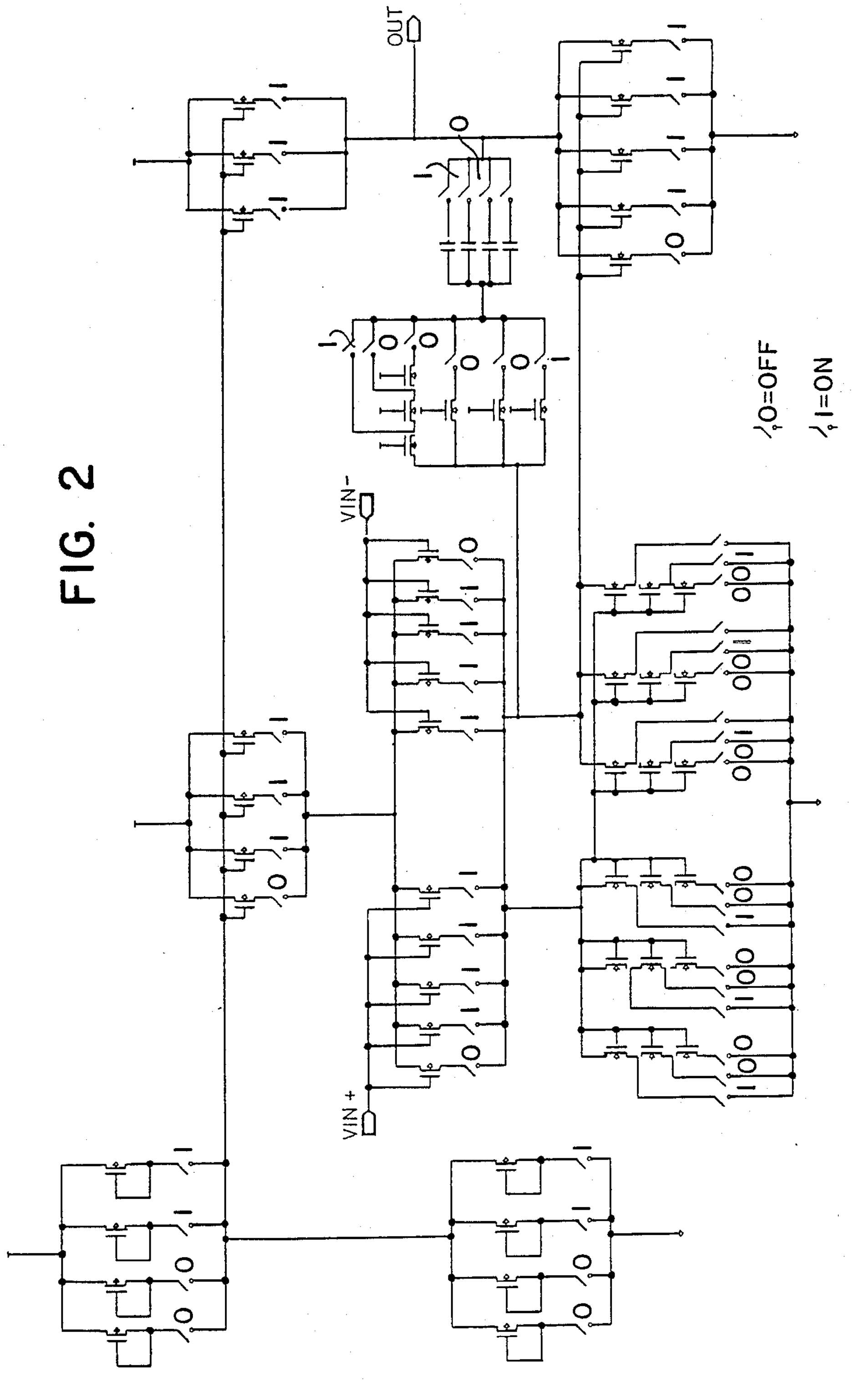
FIGS. 2 and 3 are circuit diagrams of the integrated operational amplifier of FIG. 1, wherein the circuit components networks forming the functional circuit of the operational amplifier are differently selected by changing the state of selection integrated switches.
Figure 3:
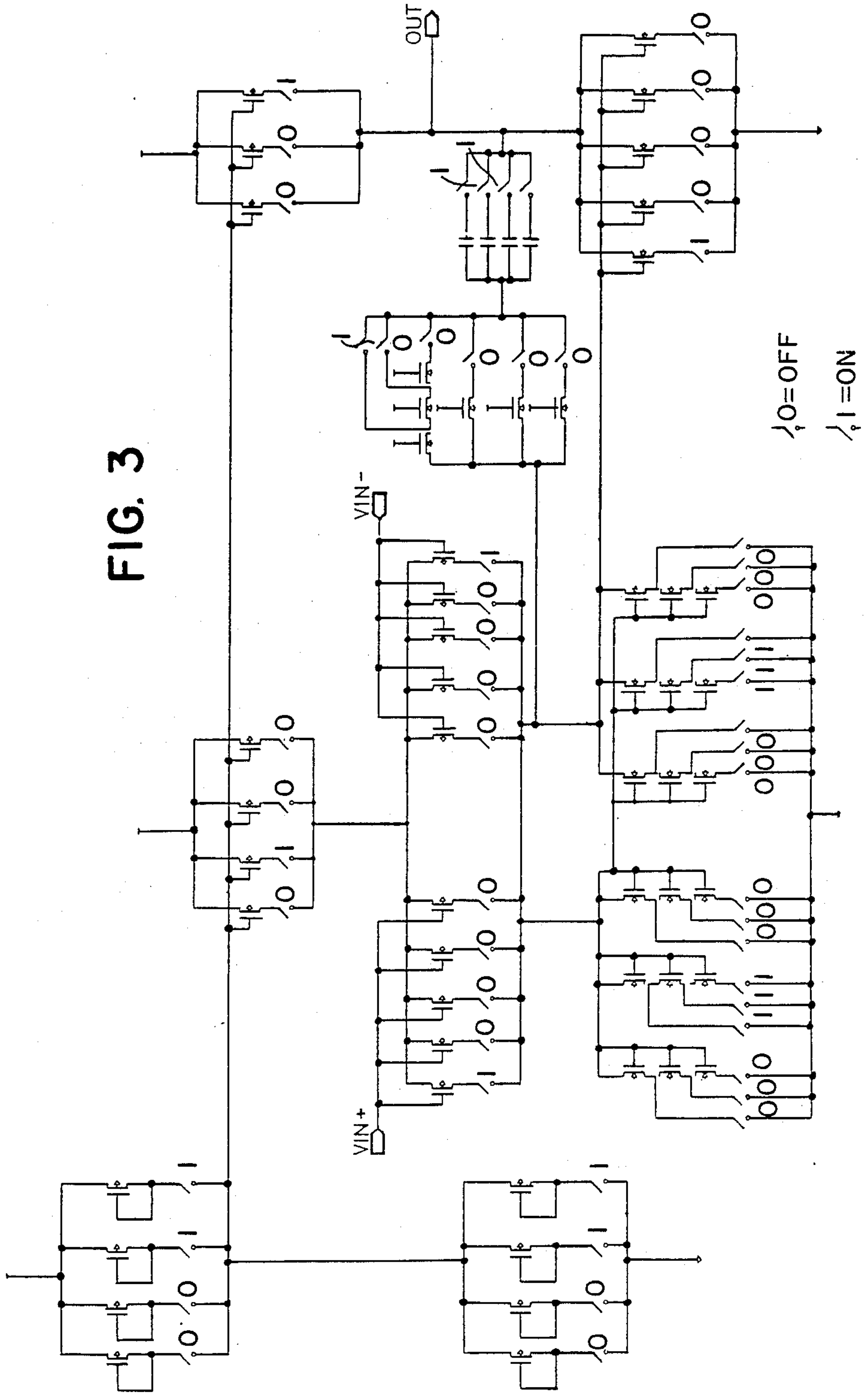

For a CMOS embodiment of the invention and by supposing to implement a "linear" type variation possibility of the parameters of the components, i.e. to make the single components of each battery identical and exploiting an incremental type range of variation of the intrinsic parameters of the functional circuit of the operational amplifier, the limits of which being represented by the intrinsic structural parameters of a unitary component and the "sum" of the intrinsic structural parameters of all the unitary components of a certain battery representing a functional component of the amplifier's circuit, two distinct configurations of the state of the selection switches in order to form two operational amplifiers having the same functional circuit but having different intrinsic characteristics, are shown in the FIGS. 2 and 3, wherein the particular state of the switches is indicated in the "legend".

Figure 4:
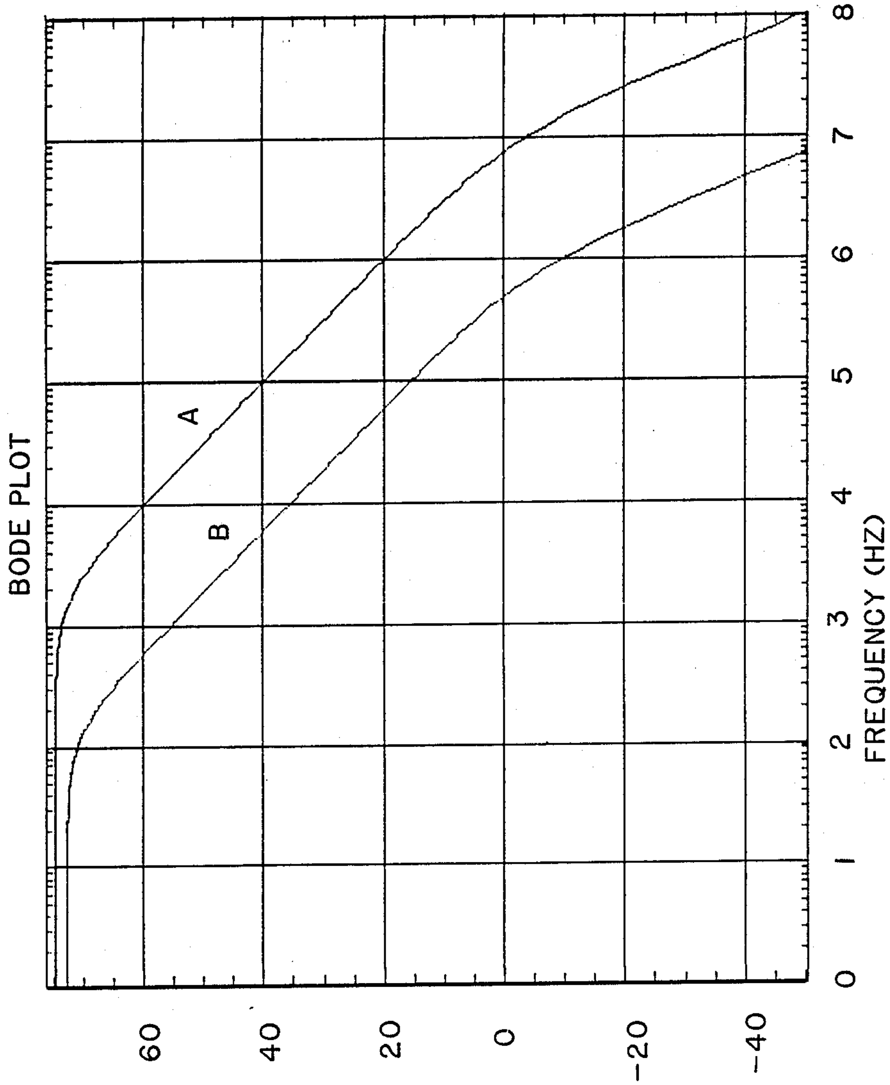
FIG. 4 shows the Bode diagrams of the operational amplifiers of the circuits of FIGS. 2 and 3 respectively.
Figure 5:
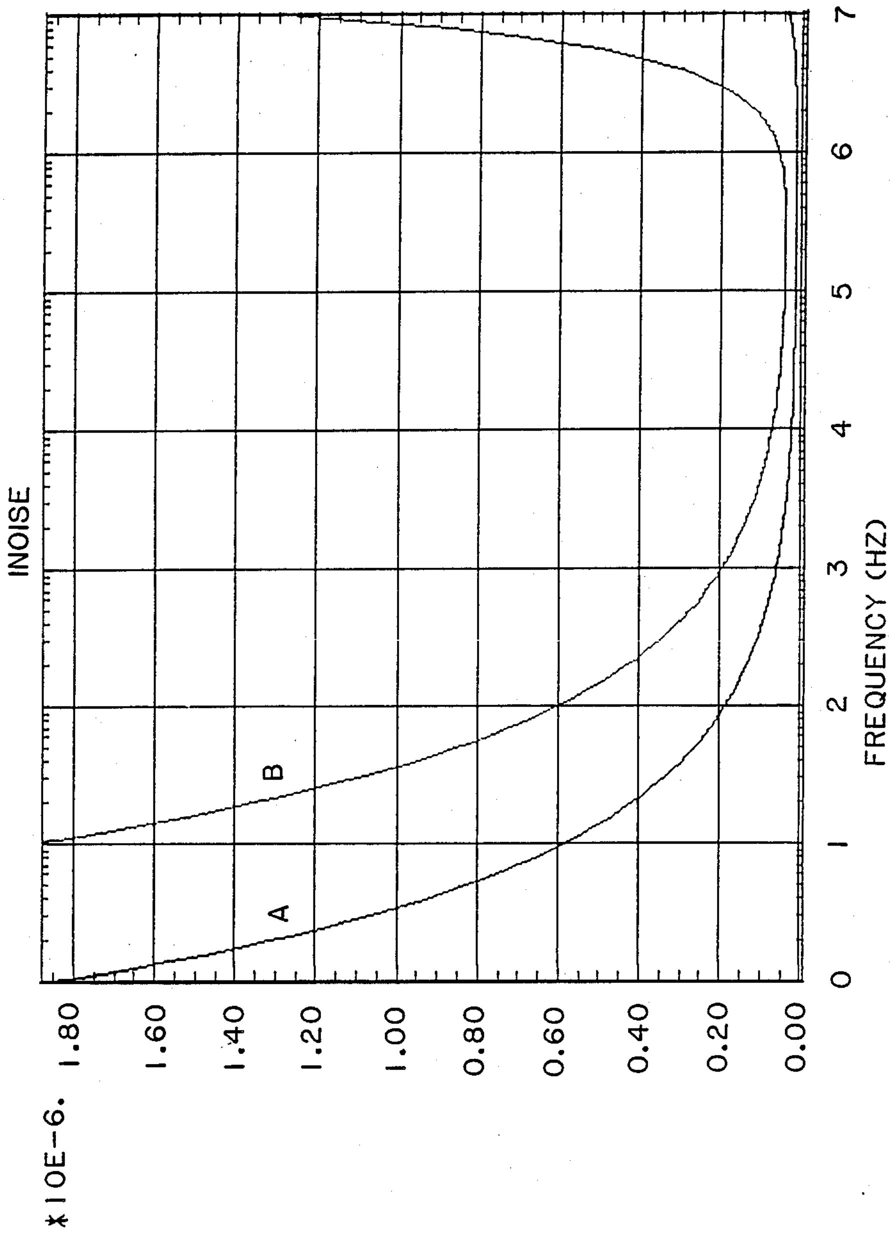
FIG. 5 shows the noise characteristic diagrams of the input stage of the operational amplifiers of the circuits of FIGS. 2 and 3 respectively.
Figure 6:
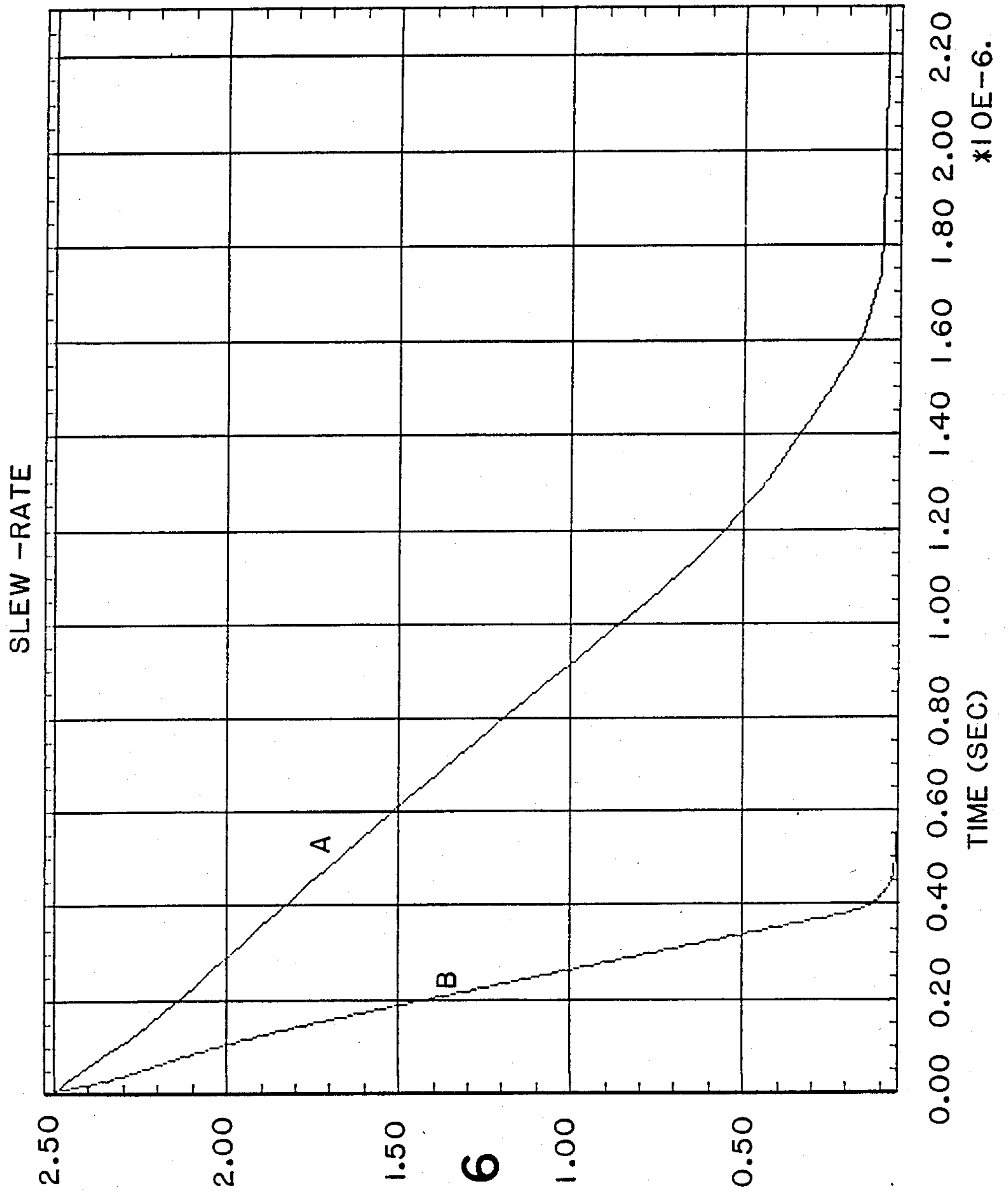
FIG. 6 shows the slew-rate diagrams of the operational amplifiers o the circuits of FIGS. 2 and 3 respectively.

In FIGS. 4, 5 and 6 several intrinsic electrical characteristics of the operational amplifier, relative to the amplifier obtained by the configuration the selection switches shown in FIG. 2 and, respectively, by the configuration of the selection switches shown in FIG. 3, are compared.

The Bode diagrams (the modulus of the amplifier's gain in function of frequency) relative to the two different operational amplifiers of FIG. 2 and of FIG. 3 are respectively shown by the curve A and by the curve B. In the diagrams of FIG. 4, the frequency scale is logarithmic; to a value 3 of the frequency corresponding a frequency of $10^3$ hertz.

A comparison between the noise characteristics, as referred to the input stage of the operational amplifier, in function of the operating frequency of the two different amplifiers of FIG. 2 and of FIG. 3 is depicted in FIG. 5 wherein the curve A relates to the amplifier of FIG. 2 and the curve B relates to the amplifier of FIG. 3.

A comparison between the slew-rate of the operational amplifier of FIG. 2 (curve A) and of the amplifier of FIG. 3 (curve B) is illustrated in FIG. 6.

The power dissipation under static conditions is also different for the amplifier of FIG. 2 in respect to that of FIG. 3. Indicatively (for a particular fabrication technology used) the amplifier of FIG. 2 would dissipate about $800\times10^{-6}$ Watt, while the amplifier of FIG. 3 would dissipate $100\times10^{-6}$ Watt.

As it may be observed in these comparisons, the intrinsic characteristics of the integrated operational amplifier of the invention in the two configurations depicted in FIG. 2 and in FIG. 3 are definitively different.

Figure 7:
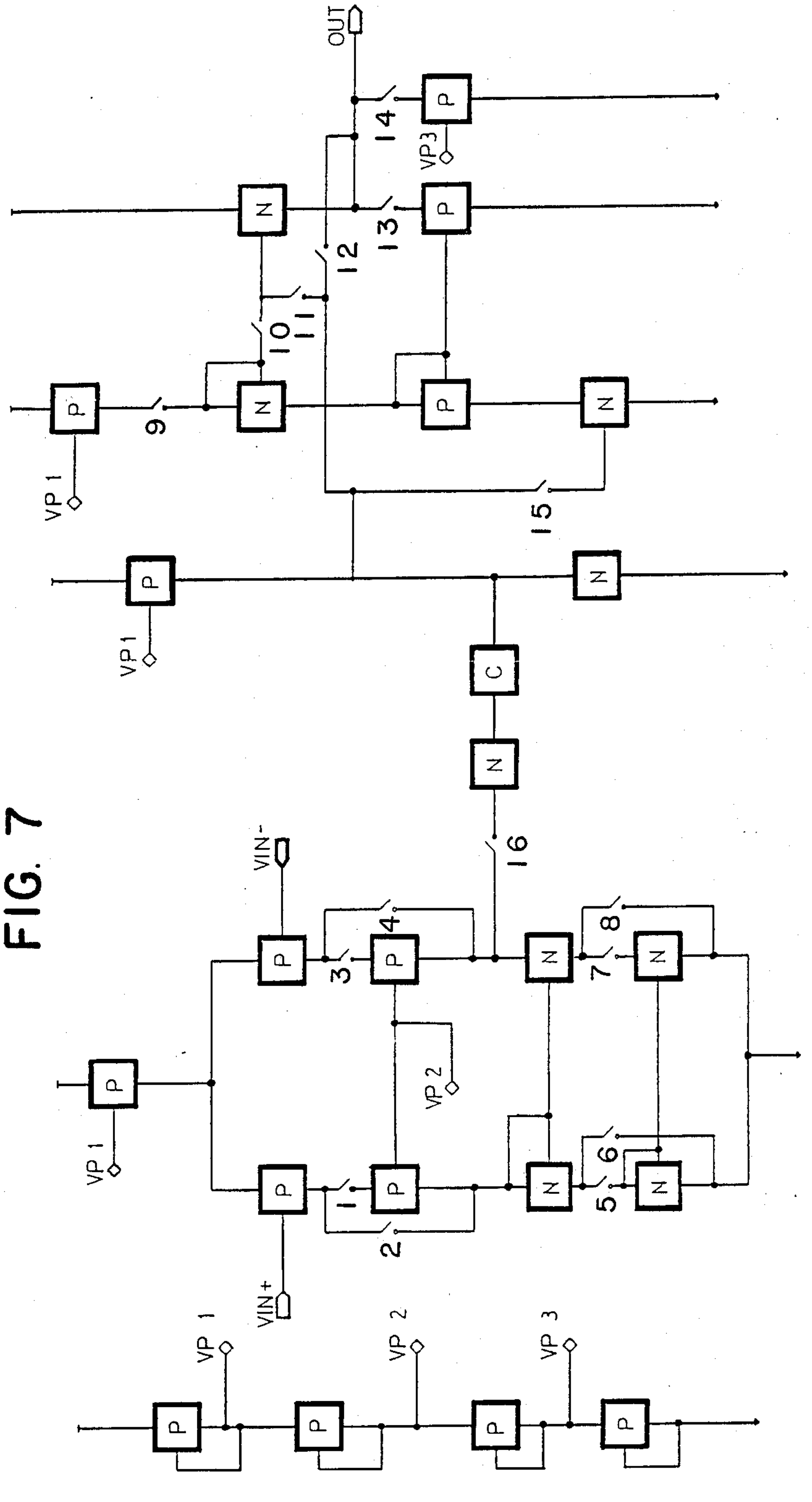
FIG. 7 is a simplified circuit diagram of an integrated analog circuit of the invention, the topology of which may be selected by digital control means.

A basic simplified circuit diagram of another integrated circuit of the invention wherein it is possible to modify the topology of the interconnection paths among the different circuit components by means of digital control means, thus obtaining functionally different analog circuits is shown in FIG. 7. The different interconnection paths among the various circuit components may be selected by opening and closing dedicated integrated analog switches, which are indicated in the diagram of FIG. 7 by means of the respective numbers from 1 to 16.

The circuit components of the integrated circuit of FIG. 7 are depicted by means of squares, inside which a letter P, N or C is inscribed for indicating a p-channel transistor, an n-channel transistor or a capacitor, respectively (the circuit being made in CMOS technology). The network of diode connected p-channel transistors on the left hand side of FIG. 7 represents the source of the constant bias voltages VP1, VP2 and VP3 of the integrated circuit.

Each circuit component indicated by a square in FIG. 7 is, preferably, a battery of similar unitary circuit components, as shown in FIGS. 8, 9 and 10. The battery depicted in FIG. 8 constitutes essentially a p-channel transistor. The characteristics of the resulting transistor may be modified by connecting in series and/or in parallel to each other more p-channel unitary transistors composing the battery by presetting a certain configuration of the integrated selection switches, as described before.

The battery depicted in FIG. 9 constitutes essentially an n-channel transistor, the characteristics of which may be incrementally modified within a wide range by connecting in series and/or in parallel to each other more n-channel unitary transistors which compose the battery by presetting a certain configuration of the relative integrated selection switches, as described above.

The battery depicted in FIG. 10 constitutes essentially a capacitor, the capacitance of which may be modified within a wide range by connecting in parallel more unitary capacitors which form the battery, as described above.

In the table shown herein below, the configuration of the sixteen integrated switches of FIG. 7 which permit, through the selection of the interconnection paths among the various integrated circuit components, to modify the topology of the integrated circuit in order to implement the respective different functional analog circuit is indicated. For the given examples of functional analog circuits (identified by the respective acronyms OP.A, OP.B, COMP, BUF.A e BUF.B) the state of each of the sixteen integrated switches may be clearly read off the following table.

| SWITCH | OP.A | OP.B | COMP | BUF.A | BUF.B |
|---|---|---|---|---|---|
| 1 | ON | OFF | OFF | OFF | OFF |
| 2 | OFF | ON | ON | OFF | OFF |
| 3 | ON | OFF | OFF | ON | OFF |
| 4 | OFF | ON | ON | ON | ON |
| 5 | ON | OFF | OFF | ON | OFF |
| 6 | OFF | ON | ON | OFF | ON |
| 7 | ON | OFF | OFF | ON | OFF |
| 8 | OFF | ON | ON | OFF | ON |
| 9 | ON | OFF | OFF | OFF | OFF |
| 10 | ON | OFF | OFF | OFF | OFF |
| 11 | OFF | ON | OFF | OFF | ON |
| 12 | OFF | OFF | ON | ON | OFF |
| 13 | ON | OFF | OFF | OFF | OFF |
| 14 | OFF | ON | OFF | OFF | ON |
| 15 | ON | OFF | OFF | OFF | OFF |
| 16 | ON | ON | OFF | ON | ON |

By setting the configuration of the topological integrated switches 1 to 16 of the integrated circuit of FIG. 7 relative to the implementation of the circuit OP.A, a high gain operational amplifier with a push-pull output stage, suitable for driving a capacitive and resistive load is obtained.

By setting the configuration of the topological integrated switches 1 to 16 of the integrated circuit of FIG. 7 relative to the implementation of the functional circuit OP.B, a wide band operational amplifier having a buffered output for a resistive load is obtained.

By setting the configuration of the sixteen integrated topological switches of the integrated circuit of FIG. 7 relative to the implementation of the functional circuit COMP, a wide band comparator with an unbuffered output is obtained.

By setting the configuration of the integrated topological switches 1 to 16 of the integrated circuit of FIG. 7 relative to the implementation of the functional circuit BUF.A, a high gain decoupling analog buffer having an output stage suited for a capacitive load is obtained.

By setting the configuration of the sixteen topological integrated switches of the integrated circuit i of FIG. 7 relative to the implementation of the functional analog circuit BUF.B, a decoupling, wide band analog buffer having an output stage suitable for driving a resistive load is obtained.

It may be noted that the examples of the illustrative table above are not exhaustive in respect to the topologies which may be obtained with the integrated circuit of FIG. 7.

Other analog functional circuits may be implemented by means of other different configurations of the sixteen topological integrated switches of the integrated circuit of FIG. 7.

Of course, for each functional analog circuit which is selected by means of the sixteen topological switches, it is possible to modify the intrinsic characteristic of the specific functional circuit within ample limits of variation by selecting a certain configuration of the selection switches of the different batteries of circuit components which form the integrated circuit of FIG. 7. A nonvolatile memory, integrated on the same chip, actuates the desired configuration of all the topological and selection switches in order to implement the desired functional analog circuit having the required intrinsic characteristics. Preferably the programming of such a nonvolatile memory is carried out by means of a software program capable of accepting input data relative to the choice of the functional circuit which must be implemented in the integrated circuit and to the intrinsic characteristics which the choosen functional analog circuit must exhibit.

What we claim is:

1. An integrated analog circuit formed by a number of integrated circuit components interconnected in a functional analog circuit and wherein the circuit topology and intrinsic characteristics are selected by digital control means among an arbitrary large number of circuit topologies and intrinsic characteristics which may be exhibited by the integrated circuit and comprising a number of batteries of circuit components, each battery circuitally representing a circuit component of an integrated functional analog circuit;

a number of alternative interconnection paths among different unitary circuit components and among different batteries of circuit components;

an integrated selection switch functionally connected in series with each circuit component of each battery and in series with each of said alternative interconnection paths;

the selection of a certain circuit component belonging to one of said batteries of circuit components and the selection of a certain interconnection path among said alternative interconnection paths effected by the closing of the respective integrated switch for implementing a functional analog circuit having a selected circuit topology and selected intrinsic characteristics which correspond to the ensemble of the intrinsic characteristics of the selected circuit components which form the functional analog circuit, being effected by means of a dedicated programmable nonvolatile memory which is integrated on the same chip as the integrated circuit.

2. The analog integrated circuit of claim 1, wherein said integrated non volatile memory is programmed by means of a software program capable of accepting as input data relative to the type of functional analog circuit which must be implemented and to the values of the different parameters which determine the intrinsic characteristics which the functional analog circuit must exhibit.

3. The integrated analog circuit of claim 1, wherein the circuit components belonging to anyone of said batteries are structurally identical and in a sufficiently large number to permit, through the connection in parallel of more unitary components of the battery, a sufficiently ample variation range of the intrinsic characteristics of the resulting circuit component, the range being comprised within the value of the intrinsic characteristics of a unitary component and the value of the intrinsic characteristics of a component resulting from the connection in parallel of all the unitary components which compose the said battery, thus implementing a substantially linear type variation of at least a functional parameter of said resulting component.

4. An integrated analog circuit of claim 1, wherein the circuit components belonging to anyone of said batteries are structurally different and in a number sufficient to permit, through the connection in parallel of more unitary components having different characteristics which compose the battery, a range of variation of the intrinsic characteristics of the resulting circuit components comprised between the value of the intrinsic characteristic of a particular unitary component and the value of the intrinsic characteristics of the component resulting from the connection in parallel of all the unitary components which form said battery of the functional analog circuit, thus obtaining a substantially exponential type variation of at least a functional parameter of said resulting component.

5. An integrated analog circuit according to claim 1, wherein said functional analog circuit having selected topology and intrinsic characteristics is an operational amplifier.

6. An integrated analog circuit according to claim 1, wherein said functional analog circuit having selected topology and intrinsic characteristics is a buffer.

7. An integrated operational amplifier having intrinsic characteristics selected by digital control means among an arbitrary large number of intrinsic characteristics which may be exhibited by the integrated operational amplifier, which has batteries of transistors and of compensation capacitors, each of said batteries circuitally representing a transistor and a compensation capacitor, respectively, of the functional circuit of the operational amplifier;

an integrated selection switch functionally connected in series with each transistor and each compensation capacitor of said batteries of transistors and of capacitors;

the selection of a certain transistor and of a certain capacitor belonging to said respective batteries by means of the closing of the relative integrated switch in order to form a functional circuit of the integrated operational amplifier having certain intrinsic characteristics corresponding to the ensemble of the intrinsic characteristics of the selected circuit components which compose the amplifier being effected by means of a nonvolatile memory integrated on the same chip as the operational amplifier and permanently programmed.

8. An amplifier according to claim 7, wherein said nonvolatile integrated memory is programmed by means of a software program capable of accepting as input data the desired value of the different parameters which determine the intrinsic characteristics of the resulting operational amplifier.

9. An integrated analog circuit in accordance with claim 1, wherein said batteries of unitary components are arranged in a matrix form, one or more unitary components of the battery being connectable electrically in series one to another and said series of unitary components being connectable electrically in parallel with respect to another of said unitary components of the battery or to another series of unitary components of the battery.

10. An integrated analog circuit according to claim 2, wherein said functional analog circuit having selected topology and intrinsic characteristics is an operational amplifier.

11. An integrated analog circuit according to claim 2, wherein said functional analog circuit having selected topology and intrinsic characteristics is a buffer.

12. An integrated analog circuit according to claim 3, wherein said functional analog circuit having selected topology and intrinsic characteristics is an operational amplifier.

13. An integrated analog circuit according to claim 3, wherein said functional analog circuit having selected topology and intrinsic characteristics is a buffer.

14. An integrated analog circuit according to claim 4, wherein said functional analog circuit having selected topology and intrinsic characteristics is an operational amplifier.

15. An integrated analog circuit according to claim 4, wherein said functional analog circuit having selected topology and intrinsic characteristics is a buffer.

16. An integrated analog circuit in accordance with claim 3, wherein said batteries of unitary components are arranged in a matrix form, one or more unitary components of the battery being connectable electrically in series one to another and said series of unitary components being connectable electrically in parallel with respect to another of said unitary components of the battery or to another series of unitary components of the battery.

17. An integrated analog circuit in accordance with claim 7, wherein said batteries of unitary components are arranged in a matrix form, one or more unitary components of the battery being connectable electrically in series one to another and said series of unitary components being connectable electrically in parallel with respect to another of said unitary components of the battery or to another series of unitary components of the battery.

* * * * *